United States Patent [19]

Gambardella et al.

[11] 4,233,133

[45] Nov. 11, 1980

[54] PASSIVATING BATH FOR SEMICONDUCTIVE BODIES

[75] Inventors: Antonio Gambardella, Cornaredo; Marco Panigada, Pavia, both of Italy

[73] Assignee: SGS-ATES Componenti Elettronici S.p.A., Agrate Brianza, Italy

[21] Appl. No.: 74,773

[22] Filed: Sep. 12, 1979

[30] Foreign Application Priority Data

Sep. 21, 1978 [IT] Italy .............................. 27906 A/78

[51] Int. Cl.$^3$ ...................... C25D 13/02; C25D 13/10
[52] U.S. Cl. ................................................ 204/181 N
[58] Field of Search .................................... 204/181 N

[56] References Cited

U.S. PATENT DOCUMENTS 3,642,597  2/1972  Sheldon .......................... 204/181 N

FOREIGN PATENT DOCUMENTS 484777  5/1938  United Kingdom ................ 204/181 N

*Primary Examiner*—Howard S. Williams
*Attorney, Agent, or Firm*—Karl F. Ross

[57] ABSTRACT

For applying a protective coating to a semiconductive body, such as a wafer or chip with exposed junctions, the body is immersed in a bath in which particles of a passivant such as glass are suspended for electrophoretic deposition on the body surface. The bath consists essentially of an organic solvent such as acetone, an amine and a hydrohalogenic acid in proportions yielding a preferably alkalinic pH between 4 and 10.

7 Claims, No Drawings

PASSIVATING BATH FOR SEMICONDUCTIVE BODIES

FIELD OF THE INVENTION

Our present invention relates to a process for protectively coating a semiconductive body, such as a wafer or chip having junction-forming layers of different conductivity types, and more particularly to a bath used in such a process.

BACKGROUND OF THE INVENTION

It is known, e.g. from U.S. Pat. No. 3,642,597, so coat such a body by immersing same in a carrier liquid of isopropanol, ethyl acetate, methanol or de-ionozed water, for example, in which particles of a finely comminuted passivating substance such as glass are suspended. Electrophoretic deposition of the particles on the substrate, i.e. the semiconductive body, is facilitated by bubbling ammonia through the liquid to activate the solution by placing a positive surface charge on these particles.

With passivating materials rich in metal oxides, such as ZnO, their interaction with ammonia results in the release of metal ions which are attracted by the negatively polarized substrate together with the suspended coating particles and tend to remain on the semiconductor surface when the particles are subsequently fused into a continuous layer. Their presence in or on the semiconductive body impairs its performance, as by increasing the leakage current of a reverse-biased diode.

The problem referred to may be somewhat alleviated through the use of glasses low in zinc oxide, yet practical experience has shown that the formation of metallic cations cannot be completely prevented in a bath of this type. It is apparent that the difficulty could be avoided by applying a negative rather than a positive surface charge to the particles, but no additive known up to now could serve this purpose.

OBJECT OF THE INVENTION

Thus, the object of our present invention is to provide an improved coating bath for semiconductors which obviates the drawback discussed above.

SUMMARY OF THE INVENTION

We realize this object, pursuant to our invention, by using as a carrier liquid an organic solvent, e.g. acetone or ethyl alcohol, and dissolving therein an amine and a hydrohalogenic acid in proportions yielding a pH between substantially 4 and 10, preferably on the alkaline side. The amine adheres to the comminuted passivant particles and propels them toward the positively charged substrate.

The amine may be of primary, secondary or tertiary character; we particularly prefer triethyleneamine for its ability to adhere to vitreous or ceramic particles suspended in the bath. The hydrohalogenic acid may be that of fluorine, chlorine, bromine or iodine, especially the first two.

The low viscosity and the high dielectric constant of an organic solvent such as acetone allow the use of granules of passivating material, such as glass, alumina or magnesia, for example, with a particle size which may be substantially smaller than in the conventional process. The granules have a high mobility which enables us to use a considerably reduced potential difference between the substrate and the associated counterelectrode. Thus, any metal ions present in the solution are attracted to the negative counterelectrode.

EXAMPLE

A glass receptable is filled with 200 cc of acetone and about 5 grams of powdered lead glass of the type commercially available under the trademarks "Innotech", "Schott" and "Corning Glass", for instance, with a mean particle size of about 10 microns. Through suitable agitation, these granules are maintained in suspension in the liquid.

Separately, we prepare a solution of 1.5 cc of triethylamine in 100 cc of acetone to which we add hydrofluoric acid at 40% concentration in an amount sufficient to establish a pH of about 9. Approximately 1 cc of this solution is added to the bath containing the suspended glass particles.

Next, a grid of platinum is immersed in the bath as a negative electrode along with a semiconductive body, such as a silicon wafer, to be treated.

This body, spaced from its counterelectrode by a distance of 1 cm, is connected for 1 to 2 minutes to the positive terminal of a source of 48 volts whereby a protective layer with a thickness of about 10 to 20 microns is formed on the silicon surface. The body is then conventionally further treated, e.g. as described in the above-mentioned U.S. patent.

This relatively low voltage, about half that normally employed heretofore, makes the operation considerably safer while resulting in a product of improved quality. The absence of toxic gases such as ammonia further enhances the safety of the operating personnel.

We claim:

1. In a process for protectively coating a semiconductive body by immersing same in a bath having particles of a vitreous or ceramic passivating material suspended therein and electrophoretically depositing said particles on the immersed body,
   the improvement wherein said bath consists essentially of an organic solvent, an amine, and a hydrohalogenic acid in proportions yielding a pH between substantially 4 and 10.

2. The improvement defined in claim 1 wherein said hydrohalogenic acid is hydrofluoric or hydrochloric acid.

3. The improvement defined in claim 1 or 2 wherein said amine is triethylamine.

4. The improvement defined in claim 1 or 2 wherein said organic solvent is acetone or ethyl alcohol.

5. The improvement defined in claim 4 wherein said amine is triethylamine.

6. The improvement defined in claim 1 or 2 wherein the proportions of said amine and said hydrohalogenic acid are chosen to yield an alkaline pH.

7. The improvement defined in claim 1 or 2 wherein said body is biased positive with reference to a juxtaposed counterelectrode during electrophoretic deposition.

* * * * *